(12) United States Patent
Trivedi et al.

(10) Patent No.: US 6,597,219 B1
(45) Date of Patent: *Jul. 22, 2003

(54) DELAY LOCKED LOOP DESIGN WITH SWITCH FOR LOOP FILTER CAPACITANCE LEAKAGE CURRENT CONTROL

(75) Inventors: Pradeep Trivedi, Sunnyvale, CA (US); Claude R. Gauthier, Fremont, CA (US); Dean Liu, Sunnyvale, CA (US)

(73) Assignee: Sun Microsystems, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/199,422

(22) Filed: Jul. 19, 2002

(51) Int. Cl.[7] ................................................. H03L 7/06
(52) U.S. Cl. ........................ 327/158; 327/161; 327/149
(58) Field of Search ................................. 327/148, 152, 327/153, 157, 158, 161, 159, 362; 331/15, 16, 17

(56) References Cited

U.S. PATENT DOCUMENTS 5,374,904 A * 12/1994 Ishibashi ...................... 331/17
6,011,822 A * 1/2000 Dreyer ........................ 375/376
6,064,243 A * 5/2000 Matsuda et al. ............ 327/156
6,218,892 B1 * 4/2001 Soumyanath et al. ....... 327/537
6,473,485 B1 * 10/2002 Fernandez-Texon ......... 377/27

OTHER PUBLICATIONS

John G. Maneatis. "Low–Jitter Process–Independent DLL and PLL Based on Self–Biased Techniques", IEEE Journal of Solid–State Circuits, vol. 31, No. 11, Nov. 1996, pp. 1723–1732.

* cited by examiner

Primary Examiner—Timothy P. Callahan
Assistant Examiner—Cassandra Cox
(74) Attorney, Agent, or Firm—Rosenthal & Osha L.L.P.

(57) ABSTRACT

A delay locked loop design that uses a switch operatively connected to a loop filter capacitor to control a leakage current of the loop filter capacitor is provided. By positioning a switch in series with the loop filter capacitor, the leakage current of the loop filter capacitor may be controlled by switching the switch 'on' when a charge pump of the delay locked loop is 'on' and switching the switch 'off' when the charge pump is 'off,' thereby cumulatively reducing the leakage current of the loop filter capacitor throughput the operation of the delay locked loop. Control and reduction of the loop filter capacitor leakage current leads to more reliable and stable delay locked loop behavior.

18 Claims, 6 Drawing Sheets

DELAY LOCKED LOOP DESIGN WITH SWITCH FOR LOOP FILTER CAPACITANCE LEAKAGE CURRENT CONTROL

BACKGROUND OF THE INVENTION

As shown in FIG. 1, a typical computer system 10 has, among other components, a microprocessor 12, one or more forms of memory 14, integrated circuits 16 having specific functionalities, and peripheral computer resources (not shown), e.g., monitor, keyboard, software programs, etc. These components communicate with one another via communication paths 19, e.g., wires, buses, etc., to accomplish the various tasks of the computer system 10.

In order to properly accomplish such tasks, the computer system 10 relies on the basis of time to coordinate its various operations. To that end, a crystal oscillator 18 generates a system clock signal (referred to and known in the art as "reference clock" and shown in FIG. 1 as sys_clk) to various parts of the computer system 16. Modern microprocessors and other integrated circuits, however, are typically capable of operating at frequencies significantly higher than the system clock, and thus, it becomes important to ensure that operations involving the microprocessor 12 and the other components of the computer system 10 use a proper and accurate reference of time.

Accordingly, as the frequencies of modern computers continue to increase, the need to rapidly transmit data between circuit interfaces also increases. To accurately receive data, a clock signal is often transmitted to help recover data transmitted to a receiving circuit by some transmitting circuit. The clock signal determines when the data should be sampled by the receiving circuit. Typically, the receiving circuit operates better when the clock signal is detected during the middle of the time the data is valid. To this end, a delay locked loop ("DLL") is commonly used to generate a copy of the clock signal at a fixed phase shift with respect to the original clock signal.

FIG. 2 shows a portion of a typical computer system in which a DLL 30 is used. In FIG. 2, data 32 is transmitted from a transmitting circuit 34 to a receiving circuit 36. To aid in the recovery of the data 32 by the receiving circuit 36, a clock signal 38 is transmitted along with the data 32. To ensure that the data 32 is properly latched by the receiving circuit 36, the DLL 30 (which in FIG. 2 is shown as being part of the receiving circuit 36) regenerates the clock signal 38 to a valid voltage level and creates a phase shifted version of the clock signal 38. Accordingly, the use of the DLL 30 in this fashion ensures (1) that the data 32 is properly latched by triggering the receiving circuit 36 at a point in time in which the data 32 is valid.

FIG. 3 shows a configuration of a typical DLL 40. The DLL 40 uses a voltage-controlled delay line 42, composed of several delay elements 43, to delay an output clock signal, clk_out 45, with a fixed phase shift relative to an input clock signal, clk_in 44. A delay of the voltage-controlled delay line 42 is controlled by a feedback system including a phase detector 46, a charge pump 47, and a bias generator 48. The phase detector 46 detects any phase offset (i.e., phase difference) between the input clock signal 44 and the output clock signal 45 and then accordingly generates pulses on UP 49 and DOWN 51 signals that control the charge pump 47. Depending on the UP 49 and DOWN 51 pulses, the charge pump 47 transfers charge to or from a loop filter capacitor 53 via a control voltage signal, Vctrl 55. The bias generator 48 receives the control voltage signal 55 and produces bias voltages Vbn 57 and Vbp 59 that adjust the delay of the delay elements 43 in the voltage-controlled delay line 42. The DLL 40 is arranged such that the delay of the voltage-controlled delay line 42 attempts to maintain 180 degree phase shift between the input clock signal 44 and the output clock signal 45. For a more detailed background on the operation and behavior of a DLL, see J. Maneatis, "Low-Jitter Process-Independent DLL and PLL Based on Self-Biased Techniques," IEEE Journal of Solid-State Circuits, vol. 31, no. 11, November 1996.

SUMMARY OF INVENTION

According to one aspect of the present invention, an integrated circuit comprises: a phase detector arranged to detect a phase difference between a first clock signal and a second clock signal; a charge pump arranged to output a control voltage signal dependent on the phase difference; a capacitor operatively connected to the control voltage signal; a leakage control circuit operatively connected to the capacitor and a voltage potential, where the leakage control circuit comprises a switch responsive to the phase detector; and a voltage-controlled delay line arranged to receive the first clock signal and output the second clock signal dependent on the control voltage signal.

According to another aspect, an integrated circuit comprises: means for detecting a phase difference between a first clock signal and a second clock signal; means for generating a signal dependent on the phase difference; means for storing charge to maintain a voltage potential on the signal; a switch arranged to control a leakage current of the means for storing charge dependent on the means for detecting the phase difference; and means for delaying the first clock signal in order to generate the second clock signal, where the means for delaying is dependent on the signal.

According to another aspect, a method for performing a delay locked loop operation comprises: comparing a phase difference between a first clock signal and a second clock signal; generating a control voltage signal dependent on the comparing; storing charge dependent on the control voltage signal using a capacitor; controlling, a leakage current of the capacitor with a switch positioned in series with the capacitor, wherein the switch is responsive to the comparing; and delaying the first clock signal to generate the second clock signal dependent on the control voltage signal.

Other aspects and advantages of the invention will be apparent from the following description and the appended claims.

DETAILED DESCRIPTION

As device features, such as transistor features, used to implement integrated circuit components, e.g., DLLs, continue to get smaller, they may have higher leakage currents (i.e., higher gate tunneling currents). This is due to the fact that as transistor features are designed smaller, the thickness of the transistor's oxide layer (located between the transistor's gate and the semiconductor substrate) is reduced. As the oxide layer is reduced to a few angstroms, the transistor's gate terminal begins to leak charge to the other terminals of the transistor. In the case of a DLL's filter capacitor, which is typically desired to be large from a capacitance perspective and that can be implemented with a transistor, such reduction in transistor size features and consequential increase in leakage current can adversely affect the behavior of the DLL. In some cases, particular amounts of leakage current through the DLL's filter capacitor can even cause the DLL to malfunction. Accordingly, there is a need for a DLL design that guards against or compensates for a DLL filter capacitor's leakage current.

Figure 1:
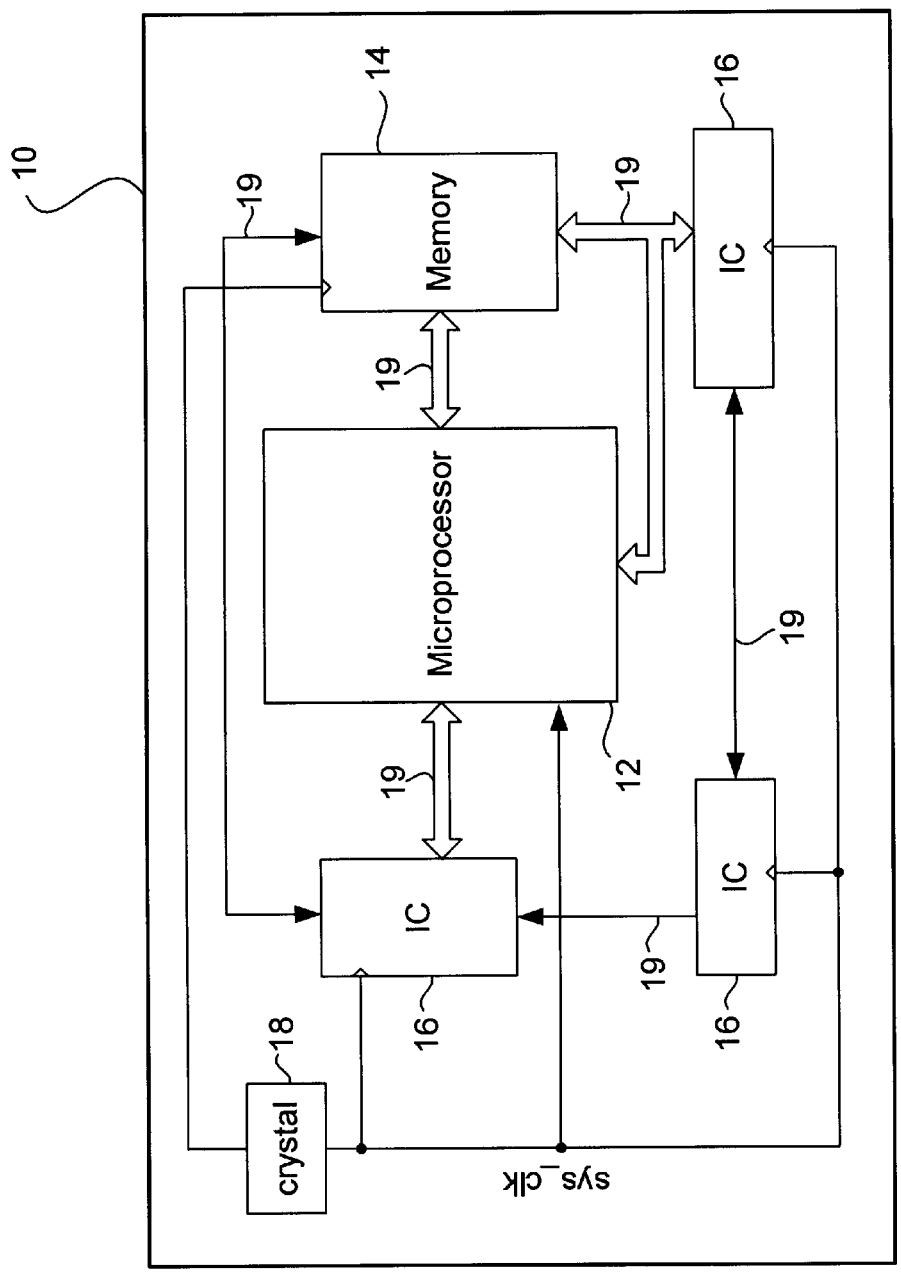
FIG. 1 shows a typical computer system.
Figure 2:
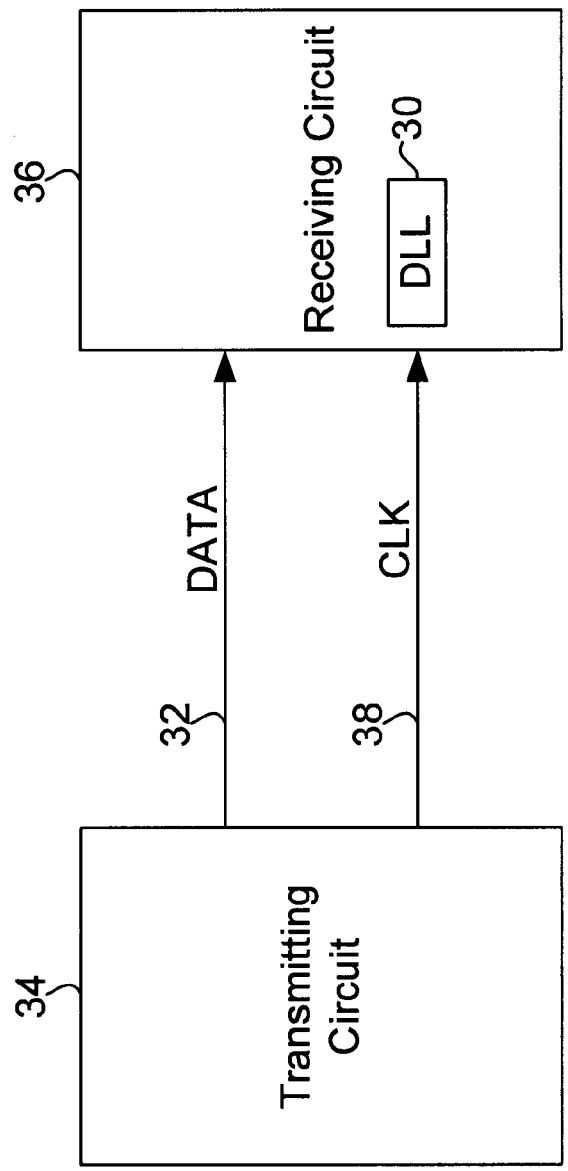
FIG. 2 shows a portion of a typical computer system in which a DLL is used.
Figure 3:
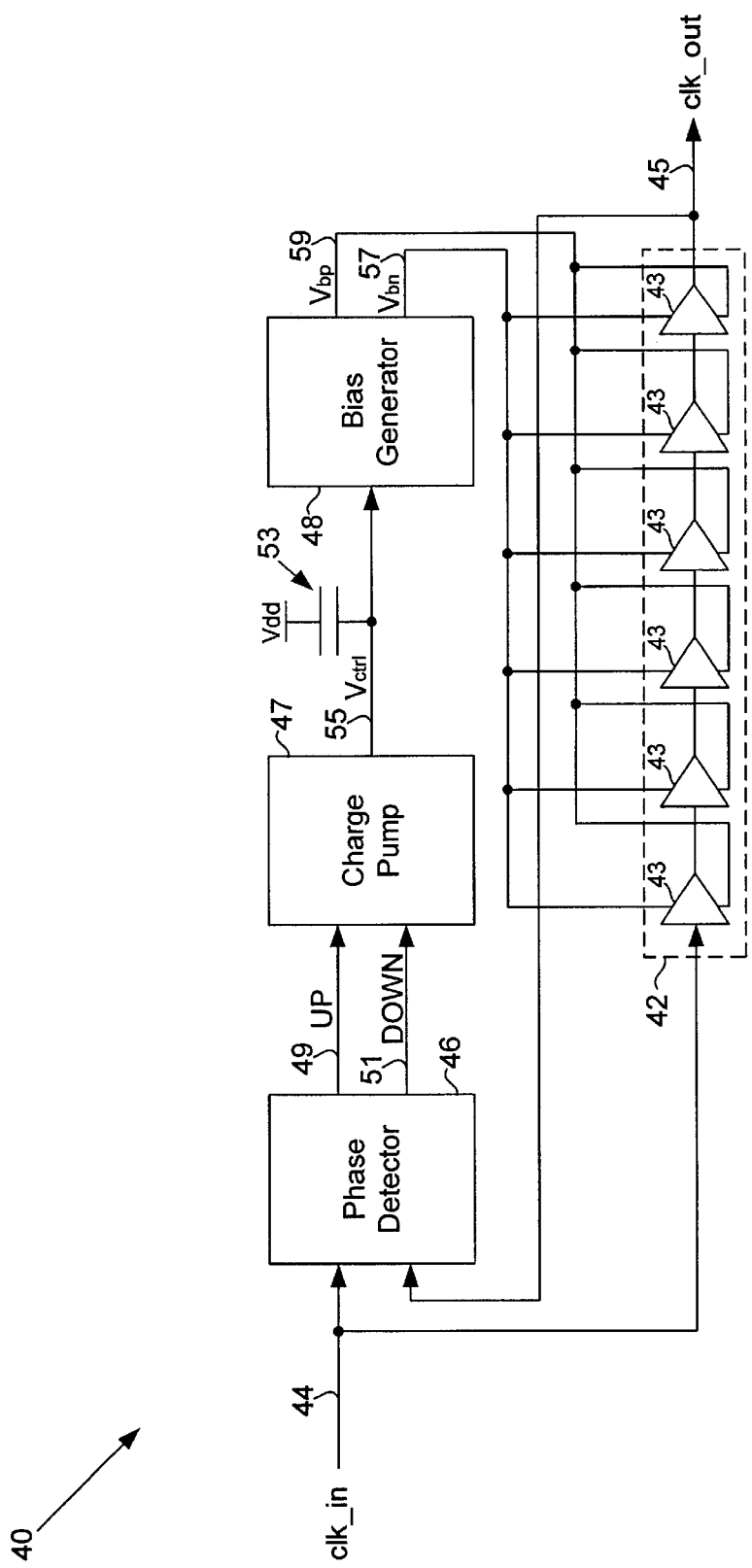
FIG. 3 shows a typical DLL.
Figure 4:
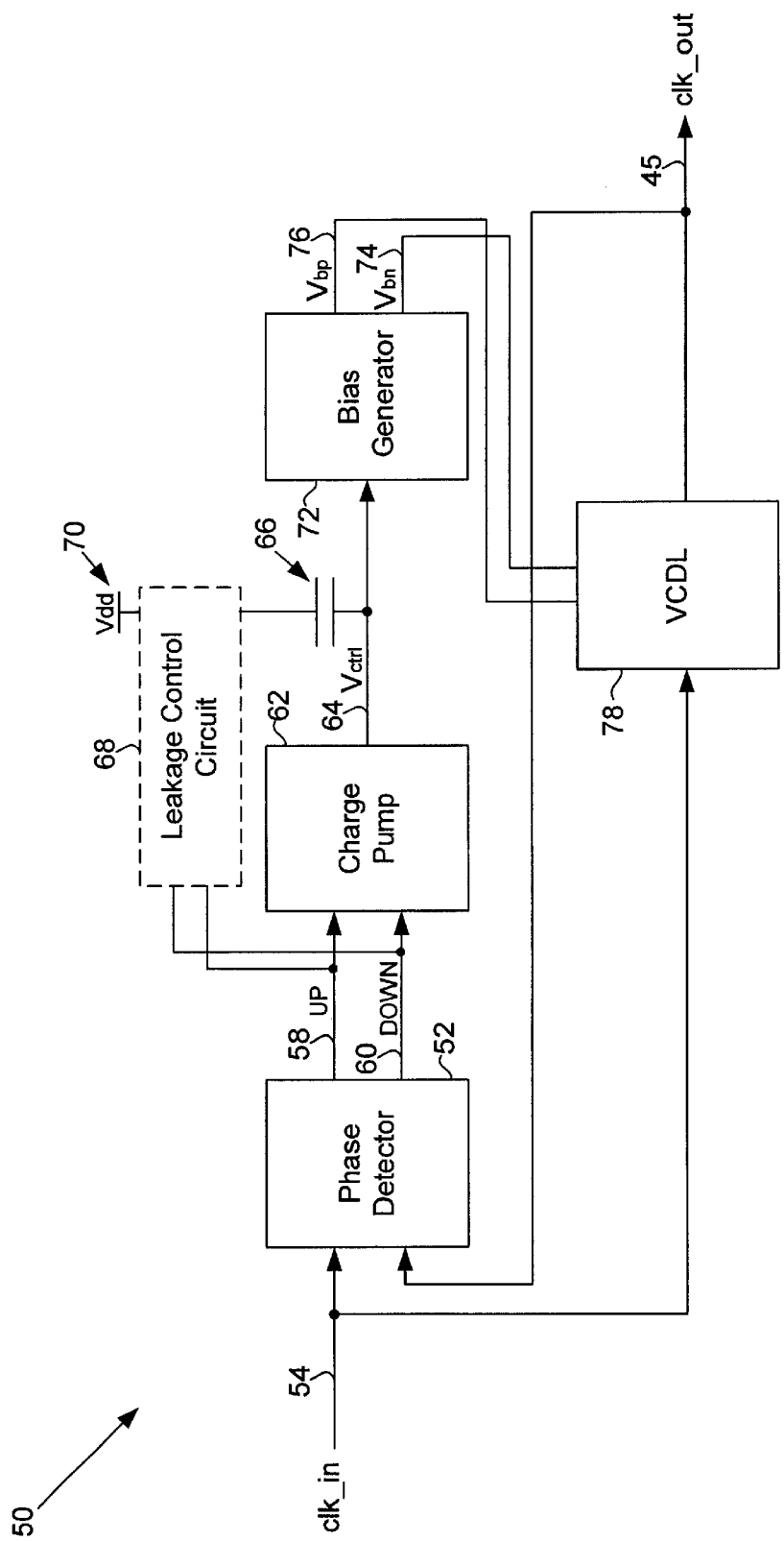
FIG. 4 shows a DLL in accordance with an embodiment of the present invention.

FIG. 4 shows a DLL 50 in accordance with an embodiment of the present invention. The DLL 50 uses a phase detector 52 that detects a phase difference between an input clock signal, clk_in 54, and an output clock signal, clk_out 56. Dependent on the phase difference detected by the phase detector 52, the phase detector 52 outputs pulses on UP 58 and DOWN 60 signals to a charge pump 62. The charge pump 62, dependent on the pulses on the UP 58 and DOWN 60 signals, generates a control voltage signal, Vctrl 64.

Figure 6:
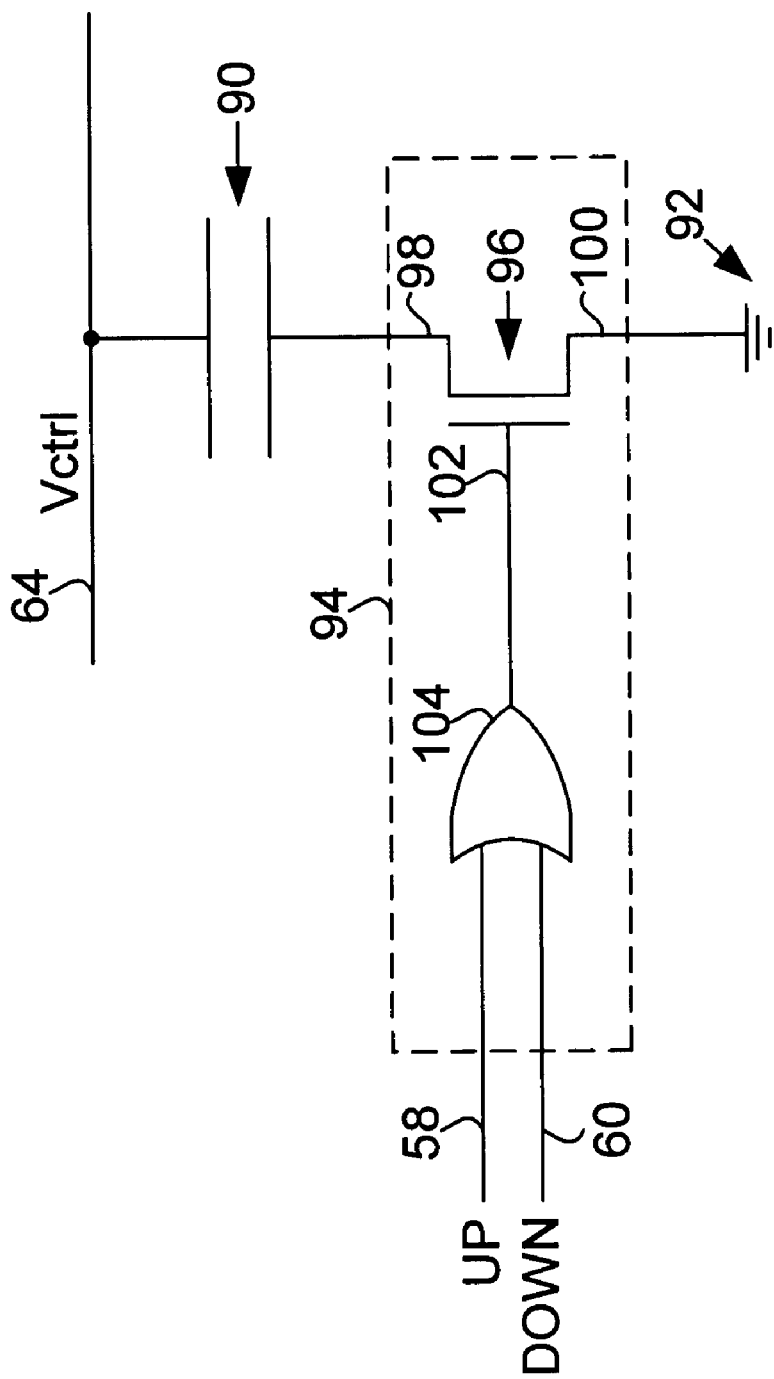
FIG. 6 shows a portion of a DLL in accordance with an embodiment of the present invention.

For stability, the DLL 50 uses a loop filter capacitor 66 that is operatively connected to the control voltage signal 64. The loop filter capacitor 66 stores/dissipates charge dependent on the control voltage signal 64. Those skilled in the art will understand that the loop filter capacitor 66 may be implemented using the gate capacitance of a metal-oxide semiconductor field-effect transistor (MOSFET). The UP 58 and DOWN 60 signals are pulsed only once per clock cycle, and therefore, the control voltage signal 64 may not be maintained due to the leakage current of the loop filter capacitor 66. To guard against increased leakage currents associated with smaller transistor features, a leakage control circuit 68 is positioned between the loop filter capacitor 66 and a voltage potential Vdd 70. Those skilled in the art will note, that in one or more other embodiments, the leakage control circuit 68 may be connected to a voltage potential Vss (as shown in FIG. 6) instead of the voltage potential Vdd 70.

As shown in FIG. 4, the leakage control circuit 68 is operatively connected to the UP 58 and DOWN 60 signals such that the leakage control circuit 68 (1) allows the loop filter capacitor 66 to leak when the charge pump 62 is 'on,'(the charge pump 62 is said to be 'on' when the charge pump 62 actively sources or sinks current to/from the control voltage signal 64) and (2) restricts the leakage current of the loop filter capacitor 66 when the charge pump 62 is 'off.' Those skilled in the art will understand that whenever one or both of the UP 58 and DOWN 60 signals is pulsed, the charge pump 62 turns 'on' for the duration of the pulse(s). A more detailed description of a leakage control circuit is given below with reference to FIGS. 5 and 6.

Referring to FIG. 4, the control voltage signal 64 serves as an input to a bias generator 72 that produces bias signals Vbn and Vbp 74 and 76 to a voltage controlled delay line 78. The voltage controlled delay line 78 inputs the input clock signal 54 and provides a delay dependent on the bias signals 74 and 76 in order to generate the output clock signal 56. The output clock signal 56, in addition to serving as an output of the DLL 50, is fed back to an input of the phase detector 52. Those skilled in the art will note that, in one or more other embodiments, the DLL 50 may be implemented without the bias generator 72 by operatively connecting the voltage controlled delay line 78 with the control voltage signal 64.

Figure 5:
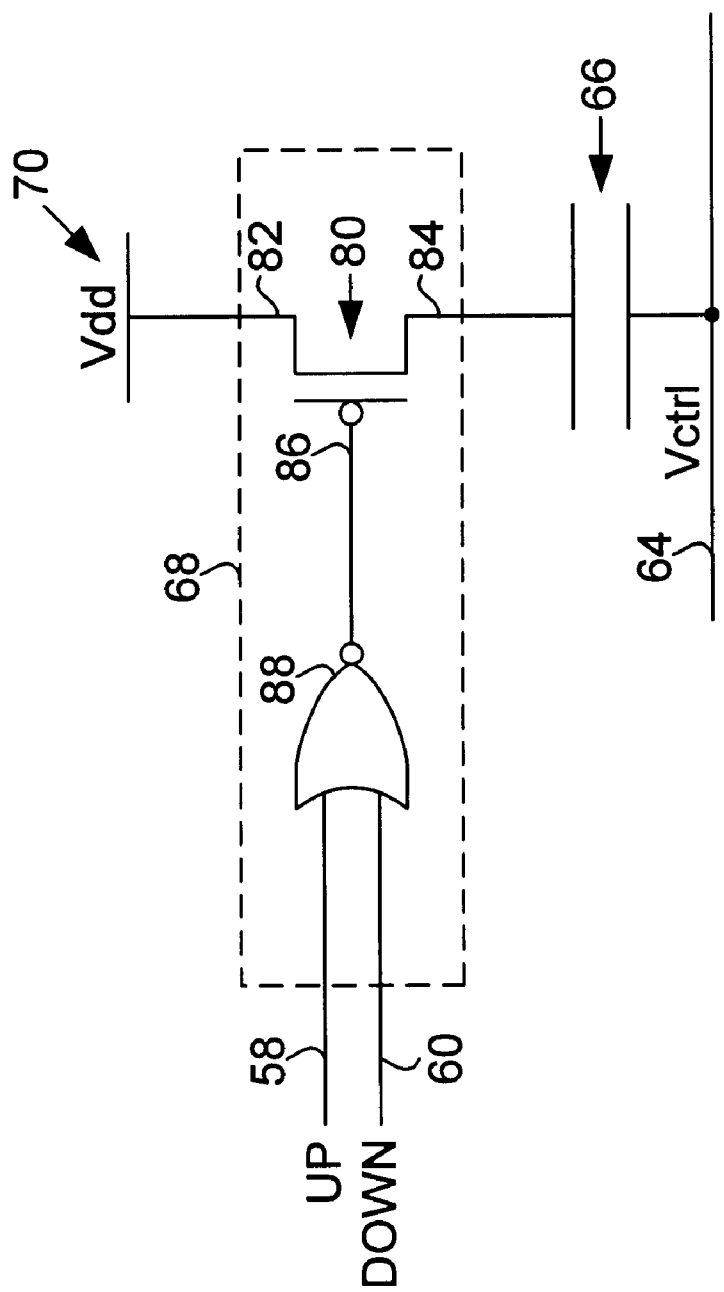
FIG. 5 shows a portion of the DLL shown in FIG. 4 in accordance with an embodiment of the present invention.

FIG. 5 shows an implementation of the leakage control circuit 68 shown in FIG. 4 in accordance with an embodiment of the present invention. In FIG. 5, the leakage control circuit 68 includes a p-channel transistor switch 80 and NOR gate circuitry 88 responsive to the UP 58 and DOWN 60 signals (from the phase detector 52 as shown in FIG. 4). More particularly, the p-channel transistor switch 80 has a first terminal 82 operatively connected to the voltage potential Vdd 70 and a second terminal 84 operatively connected to the loop filter capacitor 66. A gate terminal 86 of the p-channel transistor switch 80 is operatively connected to an output of the NOR gate circuitry 88. The NOR gate circuitry 88 outputs 'low' when one or both of the UP 58 and DOWN 60 signals are 'high' and outputs 'high' when both the UP 58 and DOWN 60 signals are 'low.' Accordingly, when one or both of the UP 58 and DOWN 60 signals are 'high,' (i.e., the charge pump (62 in FIG. 4) is 'on'), the NOR gate circuitry 88 outputs 'low' to the p-channel transistor switch 80, which, in turn, causes the p-channel transistor switch 80 to switch 'on' and allow the loop filter capacitor 66 to leak. Conversely, when both the UP 58 and DOWN 60 signals are 'low' (i.e., the charge pump (62 in FIG. 4) is 'off'), the NOR gate circuitry 88 outputs 'high' to the p-channel transistor switch 80, which, in turn, causes the p-channel transistor switch 80 to switch 'off' and restrict the leakage current of the loop filter capacitor 66.

Due to this configuration, the leakage current of the loop filter capacitor 66 is controlled because it cannot get larger than the source to drain current of the p-channel transistor switch 80. Moreover, because the charge pump (62 in FIG. 4) is 'off' the majority of the time, the cumulative reduction of the loop filter capacitor's 66 leakage current facilitates the increased integrity of the control voltage signal 64, which, in turn, leads to reliable and stable DLL operation.

FIG. 6 shows a leakage control circuit 94 in accordance with another embodiment of the present invention. In FIG. 6, a DLL loop filter capacitor 90 is referenced to a voltage potential Vss, or ground 92, instead of the voltage potential Vdd (70 in, FIGS. 4 and 5). In this embodiment, the leakage control circuit 94 includes a n-channel transistor switch 96 an OR gate circuitry 104 responsive to the UP 58 and DOWN 60 signals (from the phase detector 52 as shown in FIG. 4). More particularly, the n-channel transistor switch 96 has a first terminal 100 operatively connected to the voltage potential ground 92 and a second terminal 98 operatively connected to the loop filter capacitor 90. A gate terminal 102 of the n-channel transistor switch 96 is operatively connected to an output of the OR gate circuitry 104. The OR gate circuitry 104 outputs 'high' when one or both of the UP 58 and DOWN 60 signals are 'high' and outputs 'low' when both the UP 58 and DOWN 60 signals are 'low.' Accordingly, when one or both of the UP 58 and DOWN 60 signals are 'high,' (i.e., the charge pump (62 in FIG. 4) is 'on'), the OR gate circuitry 104 outputs 'high' to the n-channel transistor switch 96, which, in turn, causes the n-channel transistor switch 96 to switch 'on' and allow the loop filter capacitor 90 to leak. Conversely, when both the UP 58 and DOWN 60 signals are 'low' (i.e., the charge pump (62 in FIG. 4) is 'off'), the OR gate circuitry 104 outputs 'low' to the n-channel transistor switch 96, which, in turn, causes the n-channel transistor switch 96 to switch 'off' and restrict the leakage current of the loop filter capacitor 90.

Due to this configuration, the leakage current of the loop filter capacitor 90 is controlled because it cannot get larger than the source to drain current of the n-channel transistor switch 96. Moreover, because the charge pump (62 in FIG. 4) is 'off' the majority of the time, the cumulative reduction of the loop filter capacitor's 90 leakage current facilitates the increased integrity of the control voltage signal 64, which, in turn, leads to reliable and stable DLL operation.

Those skilled in the art will understand that, in other embodiments, the switches in the leakage control circuit (68 in FIG. 5 and 94 in FIG. 6) may be implemented using devices other than p- and n-channel transistors.

Advantages of the present invention may include one or more of the following. In one or more embodiments, because a leakage current of a DLL loop filter capacitor may be controlled, a more stable and reliable operation of the DLL may be facilitated. Accordingly, the phase shift of the DLL may not drift or may not drift as much as a DLL design that does not use a switch to resistively isolate the loop filter capacitor.

In one or more embodiments, because a switch positioned in series with a DLL loop filter capacitor helps control a leakage current of the DLL loop filter capacitor, the chip area consumed by the DLL loop filter capacitor may be reduced because the DLL loop filter capacitor does not have to be as large to maintain the voltage potential on a control voltage signal.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. An integrated circuit, comprising:
   a phase detector arranged to detect a phase difference between a first clock signal and a second clock signal;
   a charge pump arranged to output a control voltage signal dependent on the phase difference;
   a capacitor operatively connected to the control voltage signal;
   a leakage control circuit operatively connected to the capacitor and a voltage potential, wherein the leakage control circuit comprises a switch responsive to the phase detector; and
   a voltage-controlled delay line arranged to receive the first clock signal and output the second clock signal dependent on the control voltage signal.

2. The integrated circuit of claim 1, wherein the voltage potential is ground.

3. The integrated circuit of claim 1, wherein the switch is positioned in series with the capacitor.

4. The integrated circuit of claim 1, wherein the capacitor is a loop filter capacitor.

5. The integrated circuit of claim 1, wherein the capacitor is implemented with a transistor.

6. The integrated circuit of claim 1, wherein the switch is implemented with a transistor.

7. The integrated circuit of claim 6, the leakage control circuit further comprising:
   circuitry with an output operatively connected to a gate terminal of the transistor.

8. The integrated circuit of claim 1, further comprising:
   a bias generator arranged to output at least one bias signal dependent on the control voltage signal.

9. An integrated circuit, comprising:
   means for detecting a phase difference between a first clock signal and a second clock signal;
   means for generating a signal dependent on the phase difference;
   means for storing charge to maintain a voltage potential on the signal;
   a switch arranged to control a leakage current of the means for storing charge dependent on the means for detecting the phase difference; and
   means for delaying the first clock signal in order to generate the second clock signal, wherein the means for delaying is dependent on the signal.

10. The integrated circuit of claim 9, further comprising means for controlling the switch.

11. The integrated circuit of claim 9, wherein the switch is positioned in series with the means for storing charge.

12. The integrated circuit of claim 9, wherein the switch is implemented with a transistor.

13. A method for performing a delay locked loop operation, comprising:
   comparing a phase difference between a first clock signal and a second clock signal;
   generating a control voltage signal dependent on the comparing;
   storing charge dependent on the control voltage signal using a capacitor;
   controlling a leakage current of the capacitor with a switch positioned in series with the capacitor, wherein the switch is responsive to the comparing; and
   delaying the first clock signal to generate the second clock signal dependent on the control voltage signal.

14. The method of claim 13, wherein the switch and the capacitor are positioned between a voltage potential and the control voltage signal.

15. The method of claim 14, wherein the voltage potential is ground.

16. The method of claim 13, wherein the capacitor is a loop filter capacitor.

17. The method of claim 13, wherein the capacitor is implemented with a transistor.

18. The method of claim 13, wherein the switch is implemented with a transistor.

* * * * *